(12) United States Patent
Kanchiku

(10) Patent No.: US 9,516,770 B2
(45) Date of Patent: Dec. 6, 2016

(54) ELECTRONIC COMPONENT HOUSING CONTAINER AND ELECTRONIC DEVICE

(71) Applicant: KYOCERA Corporation, Kyoto-shi, Kyoto (JP)

(72) Inventor: Tsuyoshi Kanchiku, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 14/416,375

(22) PCT Filed: Oct. 29, 2013

(86) PCT No.: PCT/JP2013/079295
§ 371 (c)(1),
(2) Date: Jan. 22, 2015

(87) PCT Pub. No.: WO2014/083992
PCT Pub. Date: Jun. 5, 2014

(65) Prior Publication Data
US 2015/0189775 A1   Jul. 2, 2015

(30) Foreign Application Priority Data
Nov. 29, 2012   (JP) ................................. 2012-260567

(51) Int. Cl.
*H05K 7/02* (2006.01)
*H05K 5/02* (2006.01)
(Continued)

(52) U.S. Cl.
CPC ............ *H05K 5/0217* (2013.01); *H01L 23/10* (2013.01); *H01R 13/405* (2013.01); *H05K 5/069* (2013.01);
(Continued)

(58) Field of Classification Search
CPC .................... H01L 2224/49171; H01L 23/10; H01L 2924/351; H01L 2224/4823; H01L 23/49811; H01L 2223/6622; H01L 23/04; H01L 23/047; H01L 23/057; G02B 6/4248; H05K 2201/068; H05K 2201/10984; H05K 2201/10992; H05K 3/3421; H05K 3/3447; H05K 5/0217; H05K 5/069; H01R 13/405
USPC .............. 361/807, 813, 820, 723; 174/50.63, 174/50.6, 151; 439/72; 257/178, 181, 182, 257/621, 672, 676, 678, 690, 747
See application file for complete search history.

(56) References Cited

U.S. PATENT DOCUMENTS 4,338,621 A * 7/1982 Braun ................... H01L 23/057
174/549
5,076,796 A * 12/1991 Kusayanagi ........... H01R 9/091
439/83

(Continued)

FOREIGN PATENT DOCUMENTS

JP    08-097320 A      4/1996
JP    08097320 A   *  4/1996
(Continued)

OTHER PUBLICATIONS

International Search Report, PCT/JP2013/079295, Date of Mailing: Feb. 4, 2014, 2 pgs.
(Continued)

*Primary Examiner* — James Wu
(74) *Attorney, Agent, or Firm* — Volpe and Koenig, P.C.

(57) ABSTRACT

An electronic component housing container includes a container body housing an electronic component inside a cavity constituted by a bottom plate and a side wall which surrounds a center region of the bottom plate, and an input-output terminal. The input-output terminal includes an insulation member, a pin terminal, and a ring-like member. The insulation member is bonded to a periphery of an opening of a through hole provided in the side wall so as to close the through hole. The pin terminal has a flange portion protruding from an outer peripheral surface thereof, and is pierced through the insulation member. The flange portion is bonded to the insulation member. The ring-like member is bonded to the outer peripheral surface of the pin terminal and to the insulation member, on an opposite side to a surface of the insulation member to which the flange portion is bonded.

6 Claims, 7 Drawing Sheets

(51) Int. Cl.
*H01R 13/405* (2006.01)
*H01L 23/10* (2006.01)
*H05K 5/06* (2006.01)
*H01L 23/057* (2006.01)

(52) U.S. Cl.
CPC ...... *H01L 23/057* (2013.01); *H01L 2924/0002* (2013.01); *H05K 2201/10984* (2013.01); *H05K 2201/10992* (2013.01)

(56) References Cited

U.S. PATENT DOCUMENTS 5,093,989 A * 3/1992 Beltz ................. H01L 21/50
174/544

2004/0235363 A1  11/2004  Afanasiev et al.
2011/0212640 A1   9/2011  Lange et al.

FOREIGN PATENT DOCUMENTS

| JP | 2004-228535 A | 8/2004 |
|---|---|---|
| JP | 2005-277330 A | 10/2005 |
| JP | 2009-158673 A | 7/2009 |
| JP | 2012-248777 A | 12/2012 |

OTHER PUBLICATIONS

Extended European Search Report, European Patent Application No. 13859529.3, Jun. 7, 2016, 8 pgs.

* cited by examiner

ELECTRONIC COMPONENT HOUSING CONTAINER AND ELECTRONIC DEVICE

TECHNICAL FIELD

The present invention relates to an electronic component housing container and an electronic device, the electronic component housing container for housing an electronic component. More specifically, the invention relates to an electronic component housing container and an electronic device, the electronic component housing container characterized by the shape of an input-output terminal mounted on a side wall of the electronic component housing container.

BACKGROUND ART

An example of a conventional electronic component housing container (hereinafter, may be simply referred to as a container or a package) is shown in FIG. 8. The conventional package houses a high-frequency semiconductor element, or an optical semiconductor element such as an LD (laser diode) or a PD (photodiode). The package includes a base 101, a frame body 102 bonded to an upper surface of the base 101, and an input-output terminal 103 mounted on the frame body 102.

The frame body 102 is bonded to an upper main surface of the base 101 with a brazing material such as a silver (Ag) solder so as to surround a placement portion 101a. The frame body 102 is made of a metallic material such as an Fe(iron)-Ni(nickel)-Co(cobalt) alloy or an Fe—Ni alloy.

A plurality of through holes 102a are formed on one side of the frame body 102. The input-output terminal 103 is bonded to an external side of the frame body 102. The input-output terminal 103 is composed of a flat plate 103a made of ceramics and pin terminals 104 bonded to the flat plate 103a. A plurality of through holes 103b provided with smaller openings than the through holes 102a on the frame body 102 are formed on the flat plate 103a. The through holes 103b are formed at the same intervals as the through holes 102b to pass through both main surfaces of the flat plate 103a. Metalized layers are formed around the openings of the through holes 103b.

Then, a plurality of pin terminals 104 are inserted through the plurality of through holes 103b, respectively, and brazed to the metalized layers of the flat plate 103a. The pin terminals 104 are made of metal. The pin terminals 104 are inserted and mounted through not only the through holes 103b but also the through holes 102a of the frame body 102, and mounted.

The pin terminals 104 have a function of performing input and output of high-frequency signals with an external electric circuit. Portions of the pin terminals 104 located outside the frame body 102 are bonded directly to external wiring by brazing or the like directly. Portions of the pin terminals 104 located inside the frame body 102 are bonded to bonding wires or the like for electrically connecting with an electronic component (not shown).

Then, an electronic component is fixed on the placement portion 101a of the base 101, and electrodes of the electronic component are connected to the pin terminals 104 via the bonding wires or the like. Then, a lid body (not shown) is bonded to an upper surface of the frame body 102, whereby the electronic component is hermetically housed inside the container. Thus, an electronic device as a final product is completed.

CITATION LIST

Patent Literature

Patent Literature 1: Japanese Unexamined Patent Publication JP-A 2005-277330

SUMMARY OF INVENTION

Technical Problem

In the conventional package, for example, when a bonding wire or the like is bonded to the tip of the pin terminal 104, a transverse force is applied to the tip of the pin terminal 104, and a moment acts on a portion of the pin terminal 104 brazed to the flat plate 103a. The moment may remove brazing of the pin terminal 104 from the flat plate 103a. Then, there is a problem that the airtightness of the container is impaired at the brazed portion of the pin terminal 104.

Hence, the invention has been devised in view of the problems. The object of the invention is to provide an electronic component housing container capable of increasing bonding reliability at a mounting portion of an input-output terminal and keeping airtightness, and an electronic device.

Solution to Problem

According to an embodiment of the invention, an electronic component housing container includes a container body, an insulation member, a pin terminal, and a ring-like member. The container body is comprising a bottom plate and a side wall which surrounds a center region of the bottom plate. An electronic component is housed inside a cavity surrounded by the bottom plate and the side wall. The insulation member is bonded to a periphery of an opening of a through hole provided on the side wall so as to close the through hole. The pin terminal has a flange portion protruding from an outer peripheral surface of the pin terminal. The pin terminal is pierced through the insulation member, and the flange portion is bonded to the insulation member. The ring-like member, through which the pin terminal passes, is bonded to the outer peripheral surface of the pin terminal and to the insulation member, on an opposite side to a surface of the insulation member to which the flange portion is bonded.

In the electronic component housing container, a gap may be provided between the insulation member and an outer peripheral surface of a portion of the pin terminal pierced through the insulation member.

Furthermore, in the electronic component housing container, a size of an outer periphery of the ring-like member may be smaller than a size of an outer periphery of the flange portion.

Furthermore, in the electronic component housing container, the ring-like member may be disposed inside the through hole of the side wall and may not be exposed on an outside of the through hole.

Furthermore, in the electronic component housing container, a gap may be provided between the ring-like member and an inner surface of the through hole of the side wall.

Furthermore, in the electronic component housing container, a bonding material bonding the flange portion and the insulation member and a bonding material bonding the ring-like member and the insulation member may be continuous through the outer peripheral surface of the pin terminal which is pierced through the insulation member.

Furthermore, in the electronic component housing container, the ring-like member may have a polygonal shape and a corner of the ring-like member may be bonded to the insulation member.

According to another embodiment of the invention, an electronic device includes any one of the electronic component housing containers mentioned above, and an electronic component housed inside the cavity, the electronic component being electrically connected to the pin terminal.

Advantageous Effects of the Invention

The electronic component housing container of the invention includes the pin terminal having the flange portion protruding from the outer peripheral surface of the pin terminal, the pin terminal being pierced through the insulation member, the flange portion being bonded to the insulation member, and the ring-like member making the pin terminal pass therethrough, the ring-like member being bonded to the outer peripheral surface of the pin terminal and to the insulation member on the opposite side to the surface of the insulation member to which the flange portion is bonded. The bonding strength between the pin terminal and the insulation member increases, and the airtightness of the electronic component housing container increases. Moreover, even if a force is applied to the tip of the pin terminal and a moment acts on the portion of the pin terminal bonded to the insulation member, the flange portion and the ring-like member are less prone to separate from the insulation member because the ring-like member is bonded to the opposite side of the insulation member where the flange portion is bonded. Accordingly, the airtightness is less prone to be impaired at a part where the pin terminal is mounted.

In a case where a gap is provided between the insulation member and an outer peripheral surface of a portion of the pin terminal pierced through the insulation member in the electronic component housing container, it is possible to prevent stress caused by a difference in thermal expansion between the outer peripheral surface of the pin terminal and the insulation member or other stress from being caused.

Further, in a case where the size of the outer periphery of the ring-like member is smaller than the size of the outer periphery of the flange portion, a position of a force applied from the flange portion to a surface of the insulation member to which the flange portion is bonded is different from a position of a force applied from the ring-like member on the opposite side. Accordingly, a crack is less prone to be caused in the insulation member.

Further, in a case where the ring-like member is disposed inside the through hole of the side wall, and is not exposed on an outside of the through hole, it is possible to use the entire tip of the pin terminal protruding in the side wall for a region where a bonding wire is connected. Because there is no need to reserve a region for fixing the ring-like member inside the side wall, it is possible to downsize the electronic component housing container.

Further, in a case where a gap is provided between the ring-like member and the through hole of the side wall, it is possible to prevent stress due to thermal expansion or thermal contraction from being caused between the ring-like member and the side wall. As a result, a crack is not caused in the insulation member, and the airtightness of the electronic component housing container increases.

Further, in a case where the bonding material bonding the flange portion and the insulation member and the bonding material bonding the ring-like member and the insulation member are continuous through the outer peripheral surface of the pin terminal which is pierced through the insulation member, it is possible to bond the flange portion and the ring-like member at one time and make production efficiency higher.

Further, in a case where the ring-like member has a polygonal shape and the corners of the ring-like member are bonded to the insulation member, it is possible to let the gas in and out through between each side of the ring-like member and the insulation member, a gap formed by the insulation member as well as the flange portion and the ring-like member is not sealed. Stress caused due to expansion or contraction of the gas inside the gap does not concentrate on the bonded portion of the ring-like member, and it is possible to make it easier to keep the airtightness of the electronic component housing container.

The electronic device according to the embodiment of the invention includes any of the above-mentioned electronic component housing containers and the electronic component housed inside the cavity, the electronic component being electrically connected to the pin terminal. Therefore, it is possible to provide a highly reliable electronic device which makes the airtightness less prone to be impaired from the pin terminal.

DESCRIPTION OF EMBODIMENTS

Figure 1A:
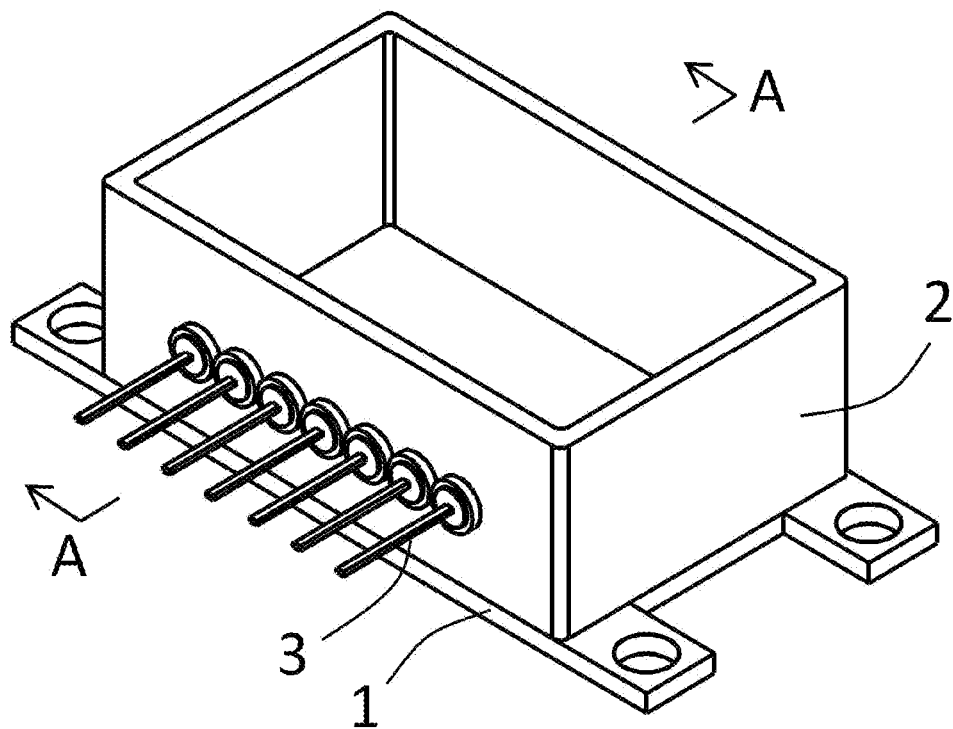
FIG. 1A is a perspective view showing an example of an electronic component housing container according to an embodiment of the invention.
Figure 1B:
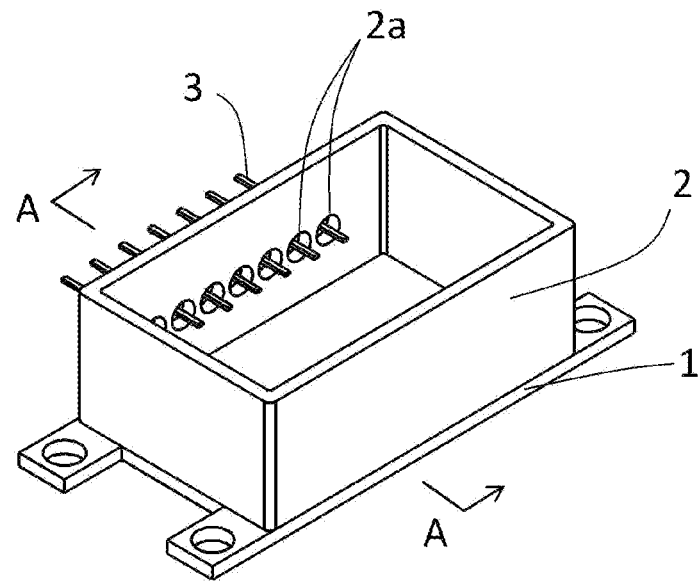
FIG. 1B is a perspective view showing the electronic component housing container of FIG. 1A when seen from a different direction.
Figure 2A:
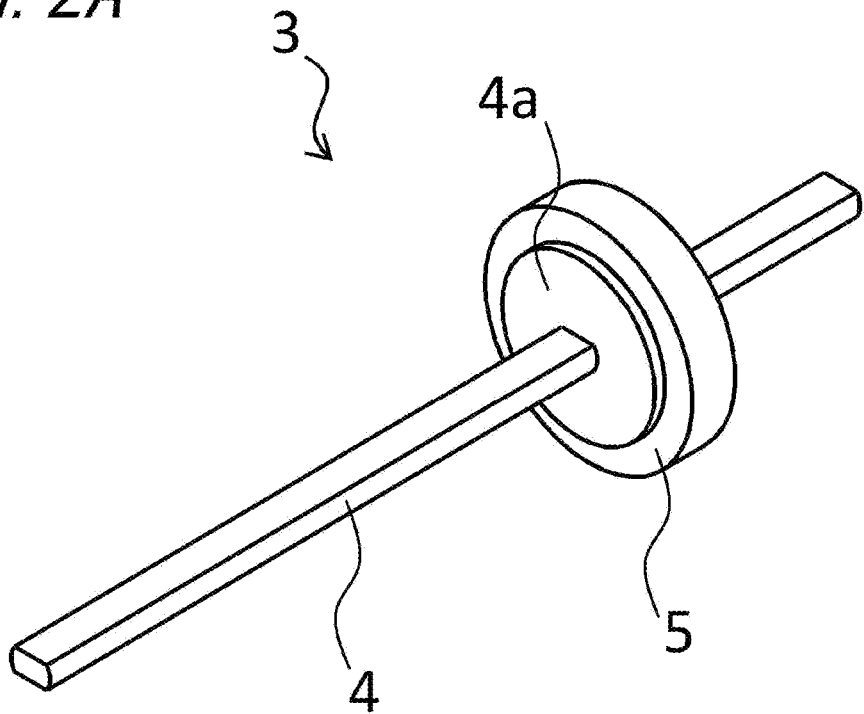
FIG. 2A is a perspective view showing an example of an input-output terminal obtained by assembling a pin terminal, an insulation member and a ring-like member in the electronic component housing container of FIGS. 1A and 1B.
Figure 2B:
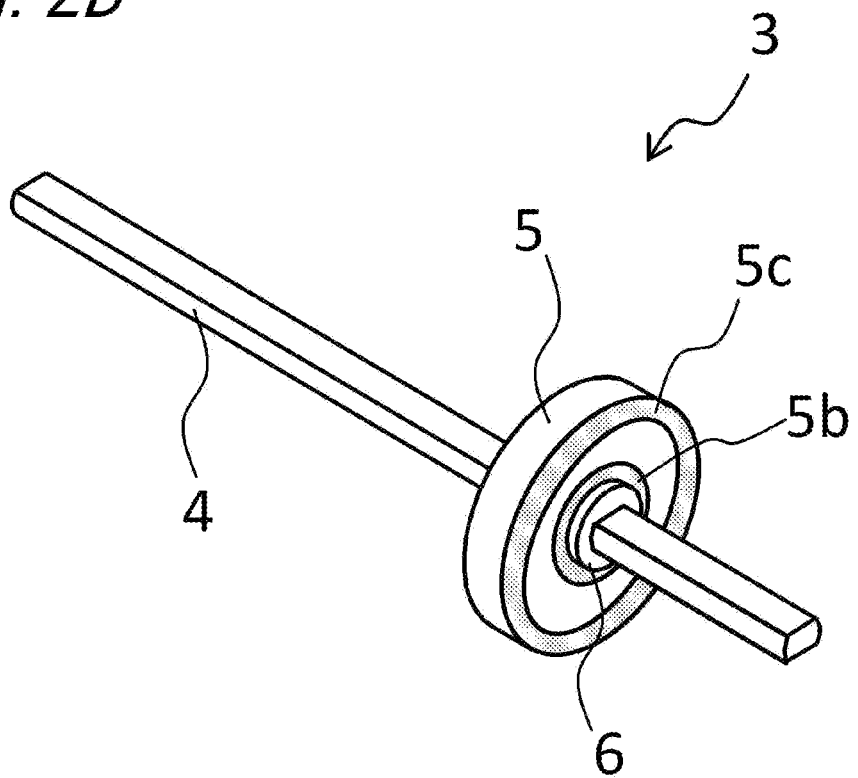
FIG. 2B is a perspective view showing the input-output terminal of FIG. 2A when seen from a different direction.
Figure 3:
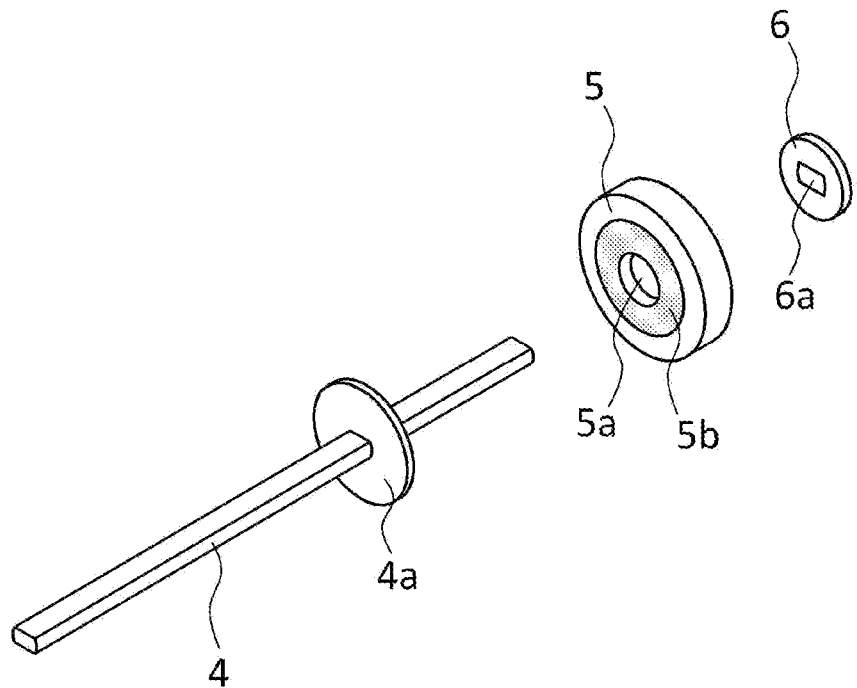
FIG. 3 is an exploded perspective view of the input-output terminal of FIG. 2A.
Figure 4:
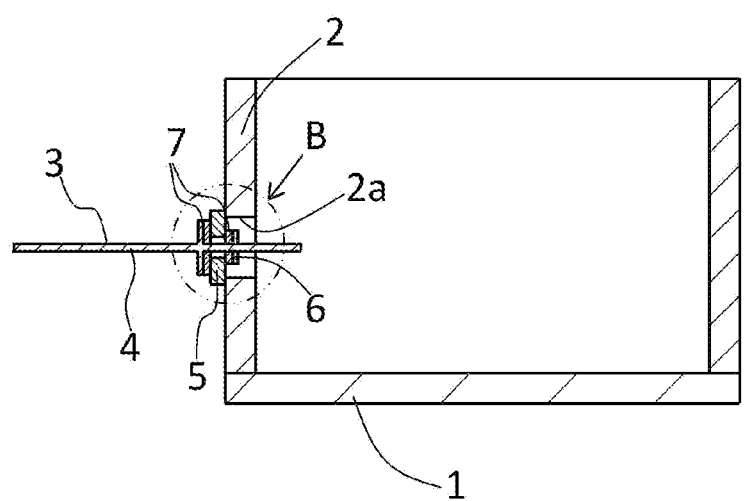
FIG. 4 is a cross section view of the electronic component housing container of FIGS. 1A and 1B taken along the line A-A.

An electronic component housing container of the invention will be described in detail as follows. FIGS. 1A and 1B show an example of the electronic component housing container according to an embodiment of the invention. FIG. 1A is a perspective view seen from a side where an input-output terminal is mounted, FIG. 1B is a perspective view seen from the rear side. Further, FIGS. 2A and 2B are enlarged, views of the input-output terminal used in the package shown in FIGS. 1A and 1B. FIG. 2A is a perspective view of the input-output terminal seen from the same direction as in FIG. 1A. FIG. 2B is a perspective view of the input-output terminal seen from the same direction as in FIG. 1B. FIG. 3 is an exploded perspective view of the input-output terminal of FIG. 2A. FIG. 4 is a cross section view taken along the line A-A in FIGS. 1A and 1B.

As shown in FIGS. 1A and 1B, the electronic component housing container of the invention includes a container body. The container body is composed of a bottom plate 1 and a side wall 2 provided on an outer peripheral portion of the bottom plate so as to surround the center region of the bottom plate 1. An input-output terminal 3 is bonded to the side wall 2.

The bottom plate 1 is shaped into a quadrangular plate or the like, on the upper main surface of which an electronic component such as a semiconductor element is placed. This bottom plate 1 is made of a metallic material such as an Fe—Ni—Co alloy and Co(copper)-W(tungsten), or ceramics (sintered compact) obtained by sintering $Al_2O_3$ (aluminum oxide), AlN (aluminum nitride), $3Al_2O_3.2SiO_2$ (mullite), or the like. The bottom plate 1 made of a metallic material is produced by, for example, processing an ingot of an Fe—Ni—Co alloy by a conventional, well-known metal processing method such as rolling and punching. The bottom plate 1 made of ceramics is produced by: admixing appropriate organic binder, solvent and so on to raw material powder to prepare a paste; forming the paste into a ceramic green sheet by the doctor blade method or the calender roll method; executing an appropriate punching process on the ceramic green sheet; and laminating the processed ceramic green sheets and firing the laminate.

In a case where the bottom plate 1 is made of a metallic material, it is preferably that on a surface of the bottom plate 1, a metal exhibiting excellent resistance to corrosion and excellent wettability with a brazing material, and specifically, an Ni layer having thickness of 0.5 to 9 μm and an Au layer having thickness of 0.5 to 5 μm are sequentially deposited by plating. This can make the bottom plate 1 less prone to undergo oxidation corrosion and excellent in bondability of brazing or the like. On the other hand, in a case where the bottom plate 1 is made of ceramics, it is preferable that a metalized layer is formed on, for example, a portion where an electronic component is placed, and an Ni layer having thickness of 0.5 to 9 μm and an Au layer having thickness of 0.5 to 5 μm are sequentially deposited on a surface of the metalized layer by plating. An electronic component and so on can be firmly bonded and fixed to the bottom plate 1 by soldering or otherwise.

As shown in FIGS. 1A and 1B, the side wall 2 is attached so as to surround the center region of the bottom plate 1. The side wall 2 is shaped into a polygonal frame having a quadrangular shape or the like seen in a plan view, on the side of which a through hole 2a is formed. The side wall 2 is made of an Fe—Ni—Co alloy, for example. The side wall 2 is produced by forming an ingot of an Fe—Ni—Co-alloy into a predetermined frame shape by a press process or the like. Otherwise, the side wall 2 may be produced integrally with the bottom plate 1 by cutting a metal ingot. A cavity surrounded by the bottom plate 1 and the side wall 2 houses an electronic component therein.

FIGS. 2A and 2B show the input-output terminal 3. The input-output terminal 3 is an assembly assembled by bonding a pin terminal 4, an insulation member 5, and a ring-like member 6. Further, FIG. 3 is an exploded perspective view of the input-output terminal. As apparent from these drawings, the input-output terminal 3 is composed of the pin terminal 4 having a flange portion 4a on an outer peripheral surface of the pin terminal 4, the ring-like insulation member 5 having one main surface to which the flange portion 4a is bonded and the other main surface on the rear side, and the ring-like member 6 attached to the other main surface of the insulation member 5. The flange portion 4a of the pin terminal 4 and the ring-like member 6 hold the insulation member 5 therebetween and are bonded to the insulation member 5. The ring-like member 6 is bonded to both the insulation member 5 and the outer peripheral surface of the pin terminal 4.

As shown in FIG. 3, the insulation member 5 is a ring-like member. The insulation member 5 is made of, for example, ceramics obtained by sintering $Al_2O_3$, AlN, $3Al_2O_3.2SiO_2$ or the like, and is provided with a through hole 5a passing through both the main surfaces thereof. Around an opening of the through hole 5a on each of the surfaces, a metallic layer 5b is formed. On the rear surface of the insulation member 5 that cannot be seen in FIG. 3, as apparent from FIG. 2B, a metallic layer 5c different from the metallic layer 5b around the opening is formed on the outside surface along the outer periphery of the insulation member. As shown in FIG. 3, the insulation member 5 has a ring-like shape, and the through hole 5a has a circular shape or an ellipsoidal shape. The outer periphery of the insulation member 5 and the through hole 5a may each have a polygonal shape.

The insulation member 5 may toe formed by molding an insulation material such as resin and glass. Forming the metallic layers 5b and 5c is favorable for bonding the pin terminal 4 and so on to the insulation member 5 by brazing, but it is not always necessary to form the metallic layers 5b and 5c in the case of bonding with a resin adhesive, for example.

The inner diameter of the through hole 5a is preferably larger than the thickness of the pin terminal 4. Thus, a gap is provided between the insulation member 5 and a portion of the pin terminal 4 pierced through the insulation member 5. The gap separates the insulation member 5 and the pin terminal 4. Therefore, thermal stress or friction force is not caused between the pin terminal 4 and the insulation member 5. Moreover, in the gap, the flange portion 4a and the ring-like member 6 are not bonded to the insulation member 5. Because the not-bonded portions of the flange portion 4a and the ring-like member 6 located in the gap can easily transform, stress caused by a moment on the pin terminal 4 can be alleviated. Consequently, it is possible to make airtightness less prone to be impaired at a portion where the pin terminal 4 is mounted.

The pin terminal 4 is, for example, a metallic rod-like member made of an Fe—Ni—Co alloy, an Fe—Ni alloy, a Cu alloy, Cu, or the like. The pin terminal 4 is shaped into, other than a quadrangular prism as shown in the drawings, a polygonal prism, a cylinder, or the like. Moreover, the flange portion 4a is formed on the outer peripheral surface of the pin terminal 4 at the middle in the length direction thereof. The flange portion 4a is produced so as to have a predetermined shape by cutting, header processing, cold forging, or otherwise. The flange portion 4a is bonded to the metallic layer 5b of the insulation member 5 by brazing or the like. The flange portion 4a can have any shape with an enough size to close the through hole 5a and hold the pin terminal 4, and may have, other than a circular shape, a polygonal shape in accordance with the shape of the insulation member 5. It is preferable that the tip of the pin terminal 4 located inside the side wall 2 is flatly deformed so as to be easily connected by a bonding wire, or the like. The pin terminal 4 is easy to be compatible with a high-power signal as compared with plated wiring formed on a board.

The ring-like member 6 is, for example, a metallic flat ring-like member made of an Fe—Ni—Co alloy, an Fe—Ni alloy, a Cu alloy, Ca, or the like, and is provided with, a hole 6a for making the pin terminal 4 pass through the center thereof. The hole 6a is formed in accordance with the shape of the outer periphery of the pin terminal 4. Moreover, the outer periphery of the ring-like member 6 preferably has an enough site to fit inside the through hole 2a of the side wall 2. In a case where the size of the outer periphery of the ring-like member 6 is smaller than the inner diameter of the through hole 2a, a gap is provided between the ring-like member 6 and the through hole 2a.

In a case where the ring-like member 6 thus has a size to fit inside the through hole 2a and moreover a gap is provided therebetween, heat distortion is not caused between the ring-like member 6 and the side wall 2 when the ring-like member 6 and the side wall 2 undergo thermal expansion or thermal contraction, respectively. As a result, if is less prone to invite a situation that deformation of the ring-like member 6 and the side wall 2 affects the insulation member 5, the insulation member 5 is cracked and the ring-like member 6 is separated from the insulation member 5. Therefore, the airtightness of the electronic component housing container increases. Moreover, in a case where the side wall 2 is made of metal, it is possible to insulate the pin terminal 4 by the gap. Herein, the size of the outer periphery refers to the diameter of the circle, when the ring-like member 6 or the flange portion 4a is shaped into a circle. When shaped into an ellipse, the size of the outer periphery refers to the length of the major axis of the ellipse, and when shaped into a polygon, the size of the outer periphery refers to the diameter of the circumscribed circle of the polygon.

The ring-like member 6 is formed so that the size of the outer periphery of the ring-like member 6 is larger than the through hole 5a of the insulation member 5, and can be bonded to an outer periphery of the opening of the through hole 5a. However, the size of the outer periphery of the ring-like member 6 is preferably smaller than the size of the outer periphery of the flange portion 4a. When a force is applied to the tip of the pin terminal 4 and a moment acts on a bonded portion to the insulation member 5, the position of the outer periphery of the flange portion 4a is outside the position of the outer periphery of the ring-like member 6, and the moment caused by the flange portion 4a and the moment caused by the ring-like member 6 act on different positions on both the sides of the insulation member 5. Therefore, it is possible to prevent stress caused on the insulation member 5 from concentrating, and it is possible to make it less prone to cause a crack in the insulation member 5. As a result, the airtightness of the electronic component housing container increases.

Figure 6A:
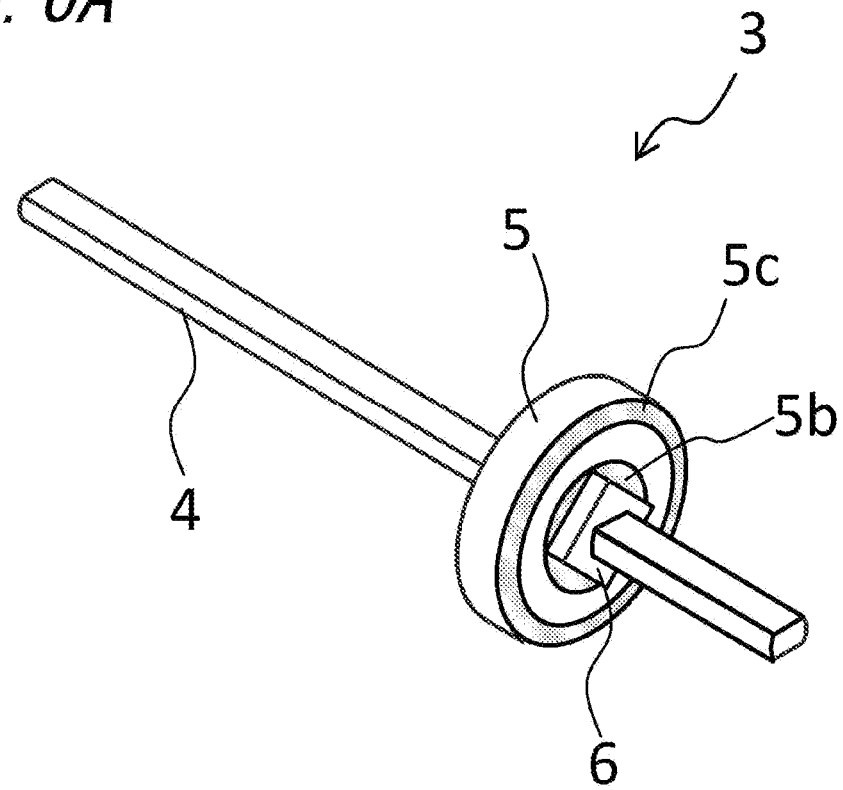
FIG. 6A is a perspective view showing another example of the input-output terminal according to the embodiment.
Figure 6B:
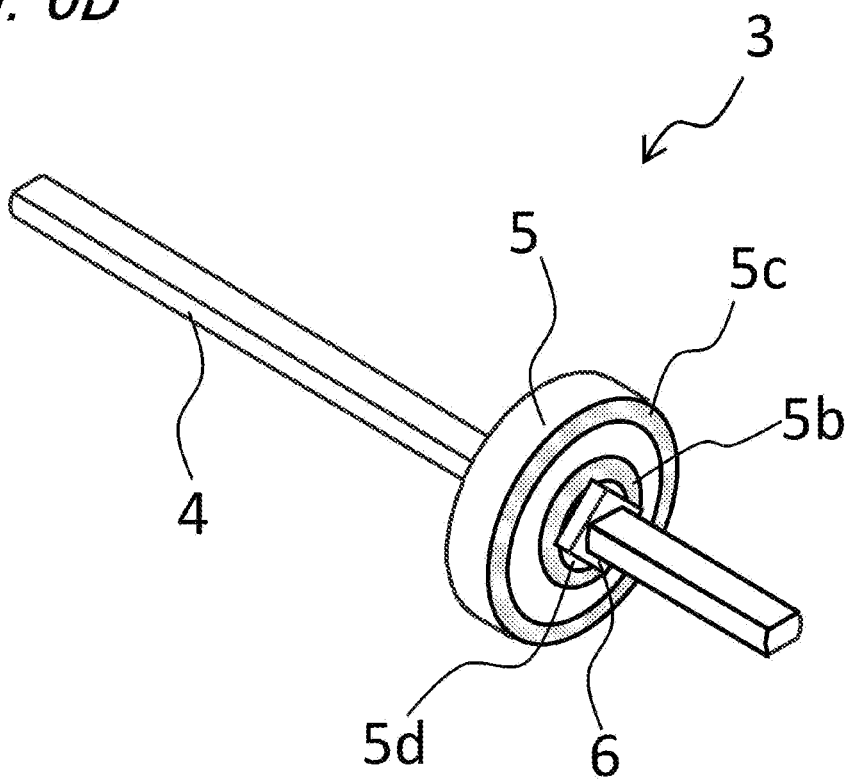
FIG. 6B is a perspective view showing another example of the input-output terminal according to the embodiment.

In a case where the ring-like member 6 has a polygonal shape, it is preferable that the ring-like member 6 is bonded at angle portions of the ring-like member 6 to the insulation member 5 as shown in FIG. 6A. Moreover, it is preferable that, as shown in FIG. 6B, a gap 5d is formed at each side portion between the angles of the ring-like member 6 and the opening of the through hole 5a is not covered by the ring-like member 6. Thus, because a space formed by the insulation member 5 and the flange portion 4a and the ring-like member 6 is opened by the gap 5d, pressure is not applied on the ring-like member 6 and so on when the gas in the gap expands. As a result, it is possible to make the ring-like member 6 less prone to separate from the insulation member 5. Moreover, hermetical sealing by a bonding material 7 which bonds the pin terminal 4 and the ring-like member 6 becomes less prone to be impaired. The ring-like member 6 may have, other than the polygonal shape, a polygonal shape with the angles protruding outward such as an asteroid, a hypocycloid or a star.

Further, the thickness of the ring-like member 6 is preferably less than the length of the through hole 2a, that is, less than the thickness of the side wall 2. Thus, the ring-like member 6 is held in the through hole 2a and does not come outside the through hole 2a. Therefore, the ring-like member 6 does not interfere with, for example, an operation of connecting a bonding wire inside the side wall. Moreover, there is no need to reserve a region for fixing the ring-like member 6 inside the side wall 2. Therefore, the length of the pin terminal 4 protruding in the through hole 2a of the side wall 2 can be made, to be shorter. As a result, the electronic component housing container can be downsized.

By inserting the pin terminal 4 through the insulation member 5 and the ring-like member 6, and thereafter, bonding the flange portion 4a to the metallic layer 5b and bonding the ring-like member 6 to the metallic layer 5b on the rear side via the bonding material 7, the input-output terminal 3 is assembled. Although a resin adhesive may be used as the bonding material 7, it is favorable regarding bondability and hermetical sealing to carry out the bonding by using the brazing material 7 such as a silver solder, a copper solder or a copper phosphorus solder.

The bonding is carried out by preparing a preform of a brazing material molded into the same shape as the metallic layer 5b, placing the preform to be held between the flange portion 4a and the insulation member 5 and between the ring-like member 6 and the insulation member 5, and then heating and cooling at predetermined temperatures.

Figure 5:
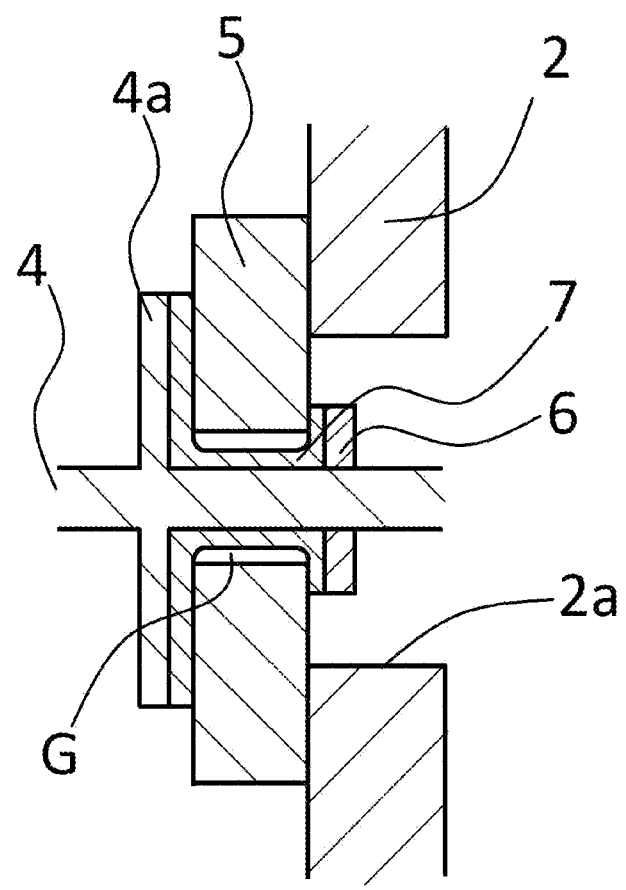
FIG. 5 is an enlarged cross section view of a B section of the electronic component housing container of FIG. 4.

It is preferable in the brazing that appropriate regulation of the amount and temperature of a brazing material causes the brazing material 7 bonding the flange portion 4a and the insulation member 5 and the brazing material 7 bonding the ring-like member 6 and the insulation member 5 to flow along the surface of the pin terminal 4 and, as shown in FIG. 5, makes the bonding material 7 continuous along the outer peripheral surface of the pin terminal 7 so as to be integrated. FIG. 5 is an enlarged cross section view of a bonded portion of the input-output terminal 3, and a substantial part enlarged view of a portion corresponding to a B section shown in FIG. 4. Consequently, it is possible to bond the flange portion 4a and the ring-like member 6 to the insulation member 5 at one time, and obtain the input-output terminal 3 having high production efficiency. Moreover, it is possible to obtain the input-output terminal 3 having high bonding strength.

The pin terminal 4 is bonded at the flange portion 4a to the insulation member 5. On the other hand, on the rear side of the insulation member 5, the ring-like member 6 is bonded to the outer peripheral surface of the pin terminal 4 and to the insulation member 5. Because the flange portion 4a and the ring-like member 6 are thus bonded to the insulation member 5 so as to hold the insulation member 5 therebetween, the flange portion 4a is less prone to separate even if a force is applied and a moment acts on the bonded portion to the insulation member 5 when, for example, the bonding wire or the like is bonded to the tip of the pin terminal 4, and it is possible to make airtightness less prone to be impaired at the mounted portion of the pin terminal 4.

After the input-output terminal 3 is assembled, the electronic component housing container is assembled as shown in FIGS. 1 and 4. The tip of the pin terminal 4 is inserted into the through hole 2a of the side wall 2, and the metallic layer 5c is bonded to the periphery of the opening with, the brazing material 7 so as to close the through hole 2a with the insulation member 5. The same number of through holes 2a as the number of the input-output terminals 3 to be mounted are provided on the side wall 2, and the insulation members 5 of the input-output terminals 3 are bonded to the periphery of the openings of the through holes 2a, respectively. The shape of the through hole 2a may be a circle, an oval, an ellipse, a polygon such as a quadrangular, or any other shapes, and should be a shape which allows the insulation member 5 to seal the through hole 2a. Shaping the insulation member 5 and the through hole 2a into a vertically long ellipse or a polygon allows high mounting density of the input-output terminal 3.

Figure 7A:
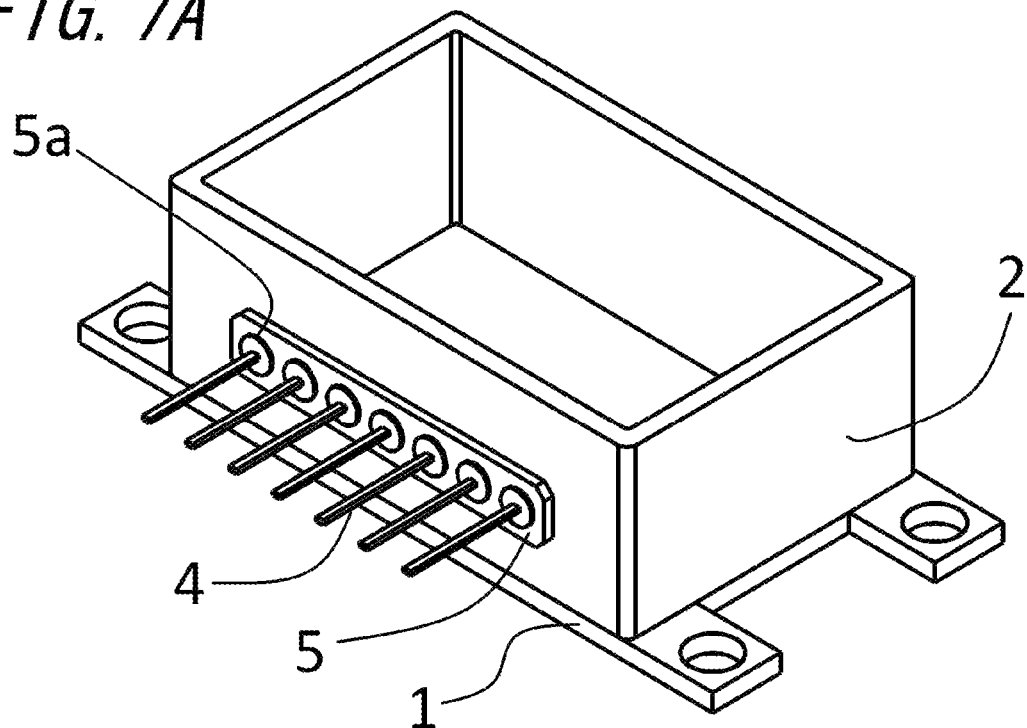
FIG. 7A is a perspective view showing another example of an electronic component housing container according to another embodiment of the invention.
Figure 7B:
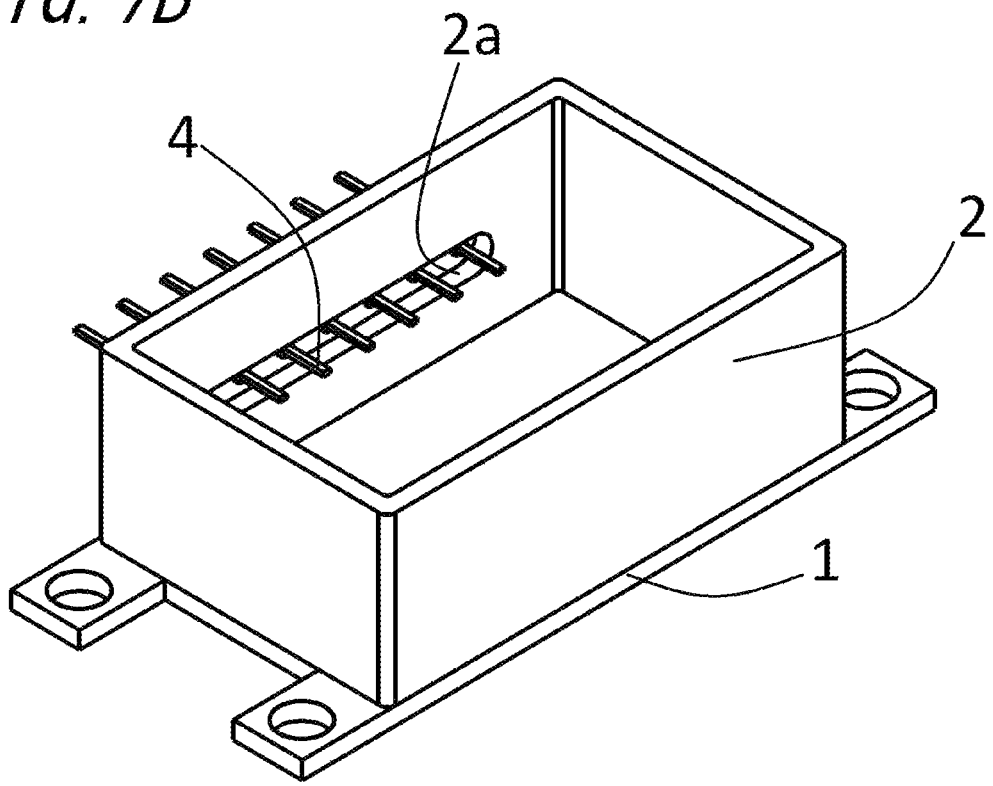
FIG. 7B is a perspective view showing the electronic component housing container of FIG. 7A when seen from a different direction.
Figure 8:
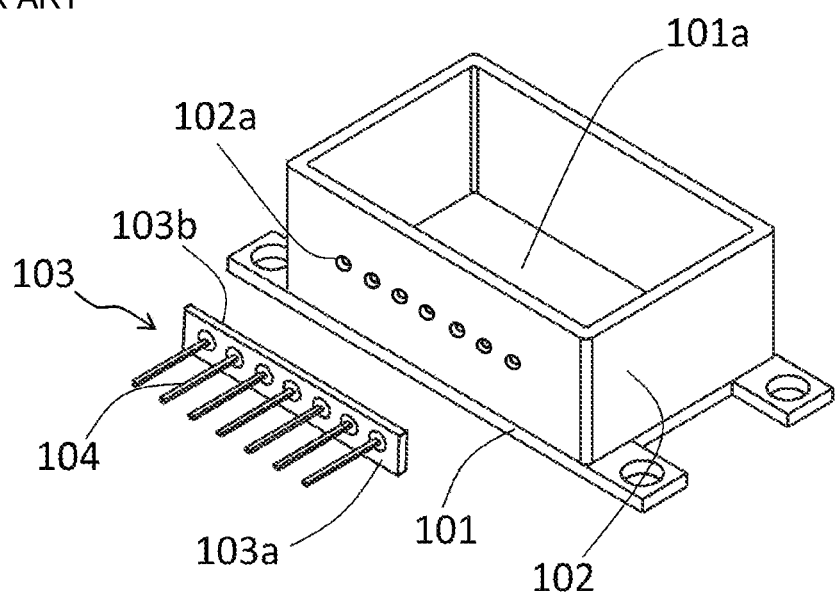
FIG. 8 is an exploded perspective view showing an example of the conventional electronic component housing container.

Further, as shown in FIGS. 7A and 7B, the input-output terminals 3 may be configured by using one-plate member having a plurality of through holes 5a as the insulation member 5, and fixing the pin terminals 4 and the ring-like members 6 in the through holes 5a. One large through hole 2a for mounting the insulation member 5 is provided on the side wall 2. Then, the insulation member 5 is bonded to the periphery of the opening of the through hole 2a so as to close the through hole 2a.

By thus configuring the input-output terminal 3 by using the one-plate insulation member 5, it is possible to simplify an operation of assembling the electronic component housing container. Furthermore, because the side wall 2 does not exist between the adjacent pin terminals 4, it is possible to suppress stress resulting from a difference in thermal expansion caused between the insulation member 5 and the side wall 2, and it is possible to suppress a crack in the insulation member 5.

A portion of the pin terminal 4 located outside the side wall 2 is bonded to an external electric circuit with solder or the like, and the pin terminal 4 bears a function of inputting and outputting electric signals. In order to facilitate soldering, it is preferable that, on the surface of the pin terminal 4, a metal having excellent resistance to corrosion and excellent wettability with solder, for example, an Ni layer having the thickness of 0.5 to 9 μm and an Au layer having the thickness of 0.5 to 5 μm are sequentially deposited by plating. Besides, the metallic portions of the bottom plate 1, the side wall 2 and so on also undergo Au plating and so on as rustproofing when necessary.

The electronic component housing container thus produced functions as an electronic device when an electronic component is housed in the cavity and the terminals of the electronic component and the tips of the pin terminals 4 are electrically connected to each other.

For example, an electronic component is adhesively fixed to the upper surface or the like of the bottom plate 1, and the electrodes of the electronic component are connected to the pin terminals 4 via bonding wires or the like. Next, a lid body is bonded to the upper surface of the side wall 2 so as to close the inside of the side wall 2, and the electronic component is hermetically housed inside a container composed of the bottom plate 1, the side wall 2, the input-output terminals 3, and the lid body.

In a case where the electronic component is an optical semiconductor element or the like, by forming an optical fiber fixture member on the side wall 2, inserting one end of an optical fiber through the optical fiber fixture member to bond them with an adhesive such as solder or laser welding to fix the optical fiber to the side wall 2, an optical semiconductor device housing the optical semiconductor element is obtained.

Use of the electronic component housing container of the invention realizes a multifunction electronic device having a high reliability on airtightness and including the input-output terminals 3 capable of inputting and outputting a number of signals.

The invention is not limited to the embodiments described above, and various modifications are possible without departing from the scope of the invention. For example, the insulation member 5 of the input-output terminal 3 may be made of an insulator such as glass or resin other than ceramics.

Further, the input-output terminal 3 is bonded from the outside of the side wall 2 in the above embodiment, but may be bonded to the inside of the side wall 2. Further, the input-output terminal 3 shown in FIG. 7 may be configured by bonding the flange portion 4a of the pin terminal 4 so as to be located inside the container and bonding the ring-like member 6 to the outside of the container. Thus, even if a force is applied to the tip of the pin terminal and a moment acts on the bonding portion to the insulation member when the tip of the pin terminal located outside the container is bonded to an external circuit with solder or the like, the ring-like member is bonded to the insulation member on the opposite side where the flange portion is bonded, and hence, the flange portion and the ring-like member are less prone to separate from the insulation member. Therefore, airtightness is less prone to be impaired at the mounted portion of the pin terminal.

The package of the invention can be used as an electronic component housing container in which a high-frequency semiconductor element for signal processing, an optical semiconductor element such as a laser diode and a light-receiving element, a piezoelectric transducer, or the like, is mounted as an electronic component.

REFERENCE SIGNS LIST

1: Bottom plate
2: Side wall
2a: Through hole
3: Input-output terminal
4: Pin terminal
4a: Flange portion
5: Insulation member
5a: Through hole
6: Ring-like member

The invention claimed is:

1. An electronic component housing container, comprising:
   a container body for housing an electronic component inside a cavity constituted by a bottom plate and a side wall which surrounds a center region of the bottom plate, the side wall being provided with a through hole;
   an insulation member bonded to a periphery of an opening of the through hole of the side wall so as to close the through hole of the side wall, the insulation member being provided with a through hole;
   a pin terminal having a flange portion protruding for all peripheral directions from an outer peripheral surface of the pin terminal, the pin terminal passing through the through hole of the insulation member, the flange portion being a metal component integrated with the pin terminal, the flange portion being bonded via a bonding material to a periphery of an opening of the through hole of the insulation member so as to close the through hole of the insulation member;

a ring-like member through which the pin terminal passes and which is bonded via the bonding material to the outer peripheral surface of the pin terminal and to the insulation member, on an opposite side to a surface of the insulation member to which the flange portion is bonded, wherein the bonding material is a different component from the flange portion, wherein a gap is provided between the insulation member and an outer peripheral surface of a portion of the in terminal pierced through the insulation member, and wherein the bonding material bonding the flange portion and the insulation member and the bonding material bonding the ring-like member and the insulation member are continuous through the outer peripheral surface of the pin terminal which is pierced through the insulation member.

2. The electronic component housing container according to claim 1, wherein a size of an outer periphery of the ring-like member is smaller than a size of an outer periphery of the flange portion.

3. The electronic component housing container according to claim 1, wherein the ring-like member is disposed inside the through hole of the side wall and is not exposed on an outside of the through hole.

4. The electronic component housing container according to claim 1, wherein the gap is provided between the ring-like member and an inner surface of the through hole of the side wall.

5. The electronic component housing container according to claim 1, wherein the ring-like member has a polygonal shape and a corner of the ring-like member is bonded to the insulation member.

6. An electronic device, comprising:
the electronic component housing container according to claim 1; and
the electronic component housed inside the cavity, the electronic component being electrically connected to the pin terminal.

* * * * *